United States Patent
Kaiser

(10) Patent No.: US 10,241,415 B2
(45) Date of Patent: Mar. 26, 2019

(54) LIGHT SOURCE ARRANGEMENT FOR A PHOTOLITHOGRAPHY EXPOSURE SYSTEM AND PHOTOLITHOGRAPHY EXPOSURE SYSTEM

(71) Applicant: SUSS MicroTec Lithography GmbH, Garching (DE)

(72) Inventor: Paul Kaiser, Munich (DE)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 0 days.

(21) Appl. No.: 15/650,339

(22) Filed: Jul. 14, 2017

(65) Prior Publication Data
US 2018/0017877 A1    Jan. 18, 2018

(30) Foreign Application Priority Data
Jul. 14, 2016   (DE) .................... 20 2016 103 819 U

(51) Int. Cl.
| | |
|---|---|
| G03B 27/42 | (2006.01) |
| G03F 7/20 | (2006.01) |
| G02B 26/08 | (2006.01) |
| H01L 21/027 | (2006.01) |

(52) U.S. Cl.
CPC ......... *G03F 7/70191* (2013.01); *G02B 26/08* (2013.01); *G03F 7/20* (2013.01); *G03F 7/201* (2013.01); *G03F 7/2004* (2013.01); *G03F 7/2008* (2013.01); *G03F 7/7005* (2013.01); *G03F 7/70075* (2013.01); *G03F 7/70391* (2013.01); *G03F 7/70575* (2013.01); *H01L 21/027* (2013.01)

(58) Field of Classification Search
CPC ....................................................... G03F 7/20
See application file for complete search history.

(56) References Cited

U.S. PATENT DOCUMENTS

| | | | | |
|---|---|---|---|---|
| 4,834,499 | A * | 5/1989 | Kaiser | G02B 17/02 359/618 |
| 2006/0227302 | A1* | 10/2006 | Harbers | G02B 27/0983 353/94 |
| 2010/0245796 | A1* | 9/2010 | Tanitsu | G02B 3/0062 355/67 |

* cited by examiner

*Primary Examiner* — Mesfin T Asfaw
(74) *Attorney, Agent, or Firm* — Hayes Soloway PC

(57) ABSTRACT

A light source arrangement for a photolithography exposure system comprises at least three light sources with different wavelengths, and a beam splitting unit comprising at least three inputs, one output, and at least two reflecting faces. An input is assigned to each light source and each reflecting face. The reflecting face reflects light that is emitted from the light source assigned to a corresponding input thereof into the output. The three light sources are arranged on three different sides around the beam splitting unit.

16 Claims, 3 Drawing Sheets

LIGHT SOURCE ARRANGEMENT FOR A PHOTOLITHOGRAPHY EXPOSURE SYSTEM AND PHOTOLITHOGRAPHY EXPOSURE SYSTEM

The present invention relates to a light source arrangement for a photolithography exposure system and to a photolithography exposure system.

BACKGROUND OF THE INVENTION

Photolithography exposure systems by means of which a photoresist deposited on a wafer is exposed in a photolithography method, usually comprise a light source and an optics which reflects the light generated by the light source onto a photo mask and the wafer that is to be exposed in an intensity that is as homogeneous as possible.

In addition, photolithography exposure systems now tend to be designed in a more compact way. Thus LEDs may be used as light source, which replace the comparatively large gas discharge lamps conventionally used. However, the luminous fluxes from the light emitting diodes (LEDs) are significantly lower than those of gas discharge lamps, thus a plurality of LEDs is required to achieve comparable illumination intensities. This again leads to larger LED arrangements, thus the free space will be reduced by the LEDs.

It is an objective of the invention to provide a light source arrangement and a photolithographic exposure system that need only a small footprint and also provide a high illumination intensity.

BRIEF DESCRIPTION OF THE INVENTION

The object is achieved by a light source arrangement for a photolithography exposure system comprising at least three light sources having different wavelengths, and a beam splitting unit comprising at least three inputs, one output, and at least two reflecting faces, wherein an input is assigned to each light source and each reflecting face, wherein the reflecting face reflects the light into the output that is emitted by the light source assigned to the corresponding input thereof, and wherein the three light sources are arranged on three different sides around the beam splitting unit. Here, those inputs may be assigned a reflecting face whose optical axes differ from the optical axis of the output. Here, "different wavelengths" denotes that the difference between the different wavelengths is at least 20 nm.

The invention is based on the insight that not the complete emission spectrum of the gas discharge lamp has to be generated by the LEDs, but it is completely sufficient to have the LEDs emit light in wavelengths to which the photoresist used has been adapted, that is, which expose the photoresist. LEDs of course do not emit monochromatic light in one wavelength, but light having a Gaussian distribution in a band of some nanometers around a center wavelength. For the ease of understanding however, the term "wavelength" will be used in the following to denote the center wavelength with the corresponding spectrum. Then, the intensities of the three different LED spectra may be added by means of the beam splitting unit. Thereby illumination intensities equal to those of gas discharge lamps may be achieved in the relevant wavelength range.

A beam splitting unit having three inputs and one output refers to those kind of optic assemblies by means of which light from three sources may be combined with each another and output in the same direction. For example, a beam splitting plate that is not selective regarding the spectrum comprises two inputs and two outputs.

Preferably, the light sources emit light in a wavelength smaller than 500 nm, in particular smaller than 450 nm, thus the light source arrangement may be used with a customary photoresist.

For example, the wavelength of the light corresponds to at least one of the light sources of the i-line, the h-line or the g-line of the emission spectrum of a mercury vapor lamp, thus the effective spectrum of the mercury vapor lamp is imitated. The i-line corresponds to a wavelength of about 365 nm, the h-line corresponds to a wavelength of about 405 mm, and the g-line corresponds to a wavelength of about 436 nm.

Of course LEDs having other wavelengths, in particular in the UV range, may be used. However, the wavelength of the LEDs has to be spaced sufficiently far apart from each other, thus the reflecting faces only reflect the light of the respective LEDs or enable it to pass, respectively. The selection of the wavelengths of the LEDs and of the reflecting face depend from the photoresist to be exposed, among others.

In one embodiment of the invention, the light sources comprise one or more LEDs and/or a LED array. This way a space-saving and efficient light source may be provided. Here, a separate collimator may be assigned to each LED, or a complete collimation optics is provided for all LEDs of a light source.

In one exemplary embodiment of the invention, the beam splitting unit comprises two beam splitting plates, which are arranged perpendicular to one another and which form an angle, in particular of about 45°, with the optical axes of the light source, thus a beam splitting unit having three inputs and one output may be achieved in a simple way.

Preferably, the at least one surface of each beam splitting plate forms a reflecting face of the beam splitting unit, wherein the surface is facing or opposite both to the corresponding input and output, so that the inputs, whose optical axis is different from that of the output, are assigned a reflecting face.

The surface is provided with a wavelength selective, reflective coating, for example, which reflects the light of the corresponding light source to at least 50%, preferably to at least 75%, more preferably to at least 90%, and which is basically transparent to light emitted from the other light sources. By means of the wavelength selective, reflective coatings, it is possible to reflect the light of any light source into the output without significantly impacting the intensity of the remaining light sources transmitted by the beam splitting unit. Here, the amount of loss of light intensity of the remaining light sources depends on the degree of transmission of the beam splitting plate for the respective wavelengths of the light of the remaining light sources.

In one embodiment variant, the beam splitting unit is formed by an X-cube, thus a representation in high quality may achieved.

The beam spitting unit is formed by an arrangement of four prisms, by example, which allows to reduce absorption losses.

Preferably, the complete arrangement has a rectangular cross-section. The arrangement is thus easier to handle.

The surfaces of the prisms may be provided with a wavelength selective, reflective coating, which further enhances the exposure quality.

In one embodiment of the invention, the optical axes of opposite inputs are coaxial and/or the optical axes of the output and the opposite input thereof are coaxial, which ensures an especially compact design of the beam splitting unit.

In addition, the objective is solved by a photolithography exposure system comprising a light source arrangement as described.

Preferably, the photolithography exposure system comprises an integrator optics that is arranged on the output side of the beam splitting unit, which due to the fact that only one integrator optics is needed enables a compact and cost-efficient manufacturing of the photolithography exposure system.

For example, the photolithography exposure system may comprise at least three integrator optics, which are arranged between the beam splitting unit and one of the light sources respectively, wherein an even higher efficiency regarding the illumination intensity of the photolithography exposure system may be achieved.

BRIEF DESCRIPTION OF THE DRAWINGS

Further features and advantages of the invention will become clear in the following description and from the appended Figures that will be referenced. In the Figures.

DETAILED DESCRIPTION OF THE INVENTION

Figure 1:
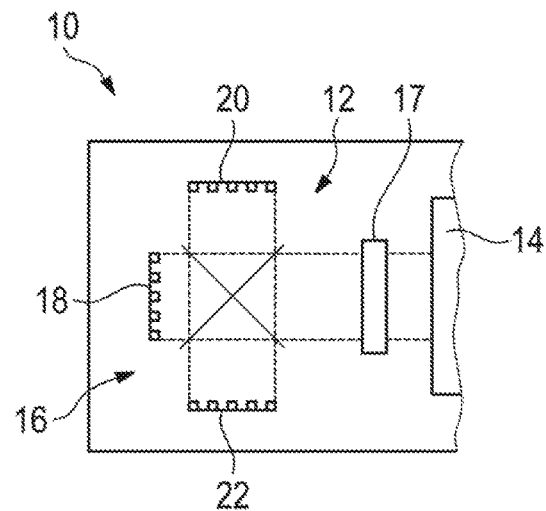
FIG. 1 shows a schematic partial view of a photolithography exposure system according to the invention.

In FIG. 1, an exposure system 10 comprising a light source arrangement 12 and an optics 14, here symbolized by the first component of the optics 14, are shown in a partly schematic way. The exposure system 10 is a photolithography exposure system.

Figure 2:
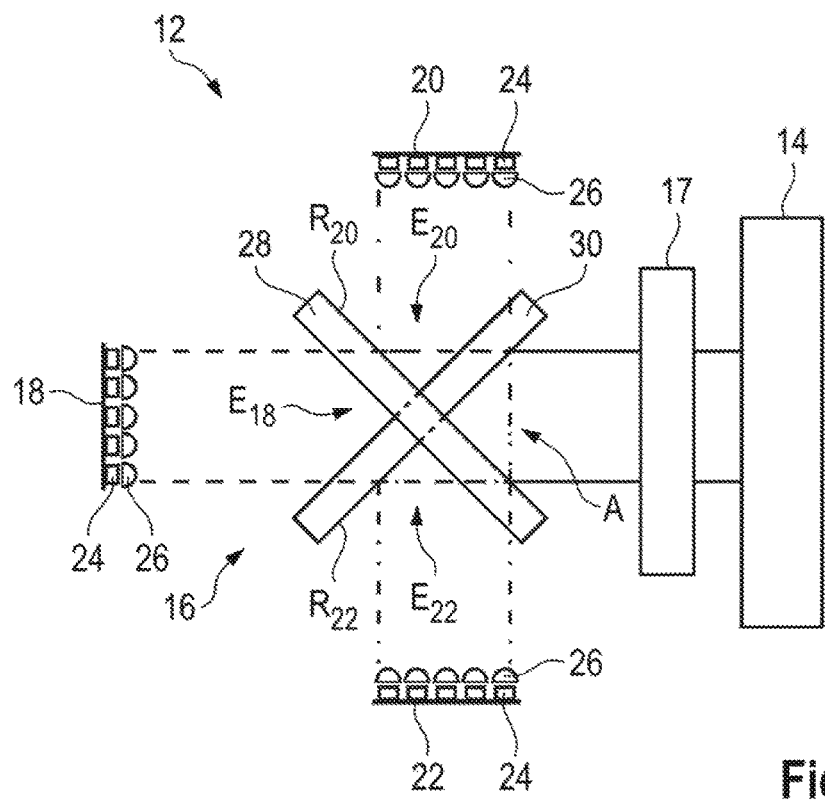
FIG. 2 shows a schematic view of a light source arrangement according to the invention.

In FIG. 2, the light source arrangement 12 and the input element of the optics 14 are shown in an enlarged way.

The light source arrangement 12 comprises a beam splitting unit 16 and an integrated optics 17 which is arranged between the beam splitting unit and the optics 14 and thus is located on the output side of the beam splitting unit 16.

In addition, the light source arrangement 12 comprises three light sources 18, 20, 22 which are arranged on three different sides around the beam splitting unit 16.

In the exemplary embodiment shown, the light sources 18, 20, 22 comprise a plurality of LEDs 24 that are arranged in a LED array. A separate collimator may be assigned to each LED 24, here for example an asphere 26, which collimates the light emitted by the LED 24 in a nearly parallel beam of rays.

Of course, also a collimation optics is possible which collimates the complete light for a light source 18, 20, 22, respectively.

The collimated light beams of the single LEDs 24 form the beam of the respective light source 18, 20, 22, where the middle axis of said light beam is considered the optical axis of the light source 18, 20, 22.

The light sources 20 and 22 are arranged on the opposite sides of the beam splitting unit 16 and are oriented towards the beam splitting unit 16, respectively, that is, light emitted by them is propagated towards the beam splitting unit 16. In the embodiment shown, the optical axes of the light sources 20 and 22 are coaxial.

The LEDs of the light source 18 emit light in a wavelength of about 405 nm, for example, which equals the h-line of the emission spectrum of a mercury vapor lamp, the LEDs 24 of the light source 20 emit light in a wavelength of about 365 nm, which equals the i-line, and the LEDs 24 of the light source 22 emit light in a wavelength of about 436 nm, which equals the g-line.

The beam splitting unit 16 comprises two beam splitting plates 28 and 30, which are arranged perpendicular to one another and which form an angle with the optical axes of the light sources 18, 20 and 22, respectively. In the exemplary embodiment shown, this is an angle of 45°.

The beam splitting plates 28 and 30 may thus be arranged in a way, that they form an X when viewed in a top view from above onto the plane defined between the optical axes, as shown in FIG. 2 and FIGS. 3a to 3c.

Thus four V-like portions are formed between the beam splitting plates 28 and 30, which are open towards one of the light sources 18, 20, 22 or to the optics 14, respectively.

The portions of the beam splitting unit 16 being open towards the light sources 18, 20, or 22 form inputs $E_{18}$, $E_{20}$, or $E_{22}$, which are assigned to one of the light sources 18, 20, or 22, respectively. The portion facing the optics 14 forms the output A of the beam splitting unit 16.

The optical axes of the input $E_{18}$, $E_{20}$, or $E_{22}$ are coaxial to the optical axis of the light sources 18, 20 or 22 assigned thereto. The optical axis of the output A is coaxial with the optical axis of the optics 14.

In addition, in the embodiment shown, the optical axes of the inputs $E_{20}$ and $E_{22}$ that are opposite to each other are coaxial. In addition, the optical axes of the output A and of the input $E_{18}$ opposite to said output are coaxial.

The beam splitting plates 28 and 30 each comprise a reflecting face $R_{20}$ or $R_{22}$. Here, the reflecting face $R_{20}$ is assigned to the input $E_{20}$ and thus to the light source 20, and the reflecting face $R_{22}$ is assigned to the input $E_{22}$ and the light source 22.

Here, the reflecting faces $R_{20}$, $R_{22}$ are formed by providing a coating on a surface of the beam splitting plates 28, 30, for example, which reflects light in a certain wavelength to at least 50%, preferably to at least 75%, and more preferably to at least 90%. However, the reflecting faces are basically transparent to light which differs from this wavelength.

The wavelength selective, reflective coating is provided on one of the surfaces of each of the beam splitting plates 28, 30, respectively.

In the embodiment shown, the wavelength selective, reflective coating is provided on the surface of the beam splitting plates 28 or 30, which is facing both the associated input $E_{20}$ or $E_{22}$—and thus the corresponding light sources 20 or 22—and also the output A. Said surfaces then form the reflecting faces $R_{20}$ and $R_{22}$.

It is also conceivable that the wavelength selective, reflective coating is deposited on the surface, which is opposite to both the associated input—and thus the corresponding light source—and to the output, and that said surface thus forms the reflecting face.

In order to align the desired degrees of reflection and transmission of the beam splitting plates 28 and the coatings thereof to one another, the reflecting face $R_{20}$ of the beam splitting plate 28 is embodied as high-pass filter, and the reflecting face $R_{22}$ of the beam splitting plate 30 is embodied as low-pass filter, wherein both reflecting faces $R_{20}$, $R_{22}$ transmit the light of the light source 18.

The reflecting face $R_{20}$ thus reflects the light of the light source 20, and is mostly transparent to light of the light sources 18 and 22. In contrast, the reflecting face $R_{22}$ reflects the light of the light source 22 and is mostly transparent to light of the light sources 18 and 20.

When the light source arrangement is operated, the light emitted by the single LEDs 24 is collimated by means of the asphere 26 and propagated through one of the inputs $E_{18}$, $E_{20}$, $E_{22}$ to the beam splitting unit 16.

Figure 3A:
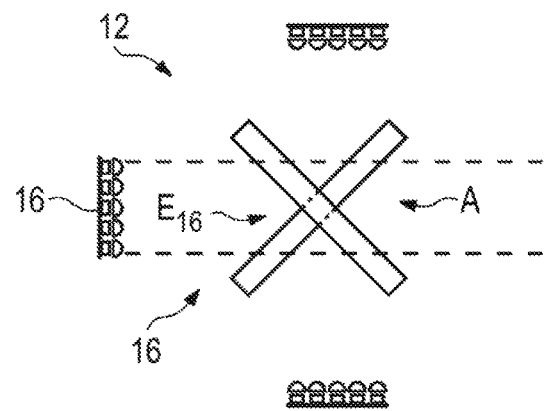
FIGS. 3a to 3c show the optical paths of the different light sources of the light source arrangement according to FIG. 2.

The light coming from the light source 18 through the input $E_{18}$ is transmitted nearly completely and passes through the output A (see FIG. 3a).

Figure 3B:
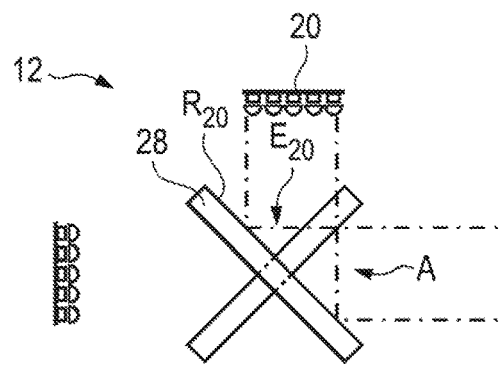
Figure 3C:
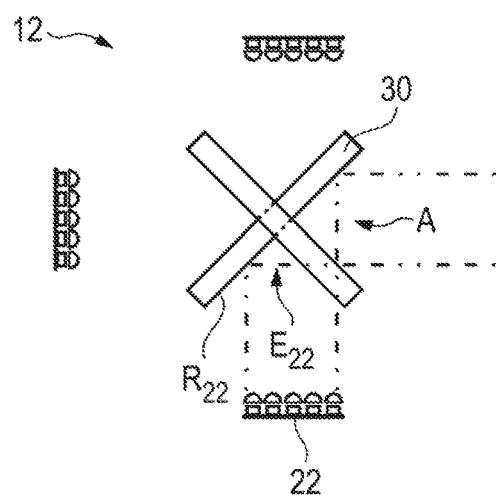

The light coming through the inputs $E_{20}$ and $E_{22}$ is reflected by the reflecting faces $R_{20}$ or $R_{22}$ towards output A, as shown by the beam paths indicated in FIG. 3b or 3b.

Finally, in output A the light of the three light sources 18, 20, 23 is superimposed, thus light in three colors, that is, light in three different wavelengths, exits the beam splitting unit 16.

Subsequently, the light passes the integrator optics 17, before it reaches the first element of the optics 14, and finally encounters the photoresist to be exposed (not shown).

Then, the photoresist absorbs the light of the wavelengths to which it has been adapted, this is in this exemplary embodiment light comprising wavelengths of 365 nm, 405 nm, or 436 mm.

Figure 4:
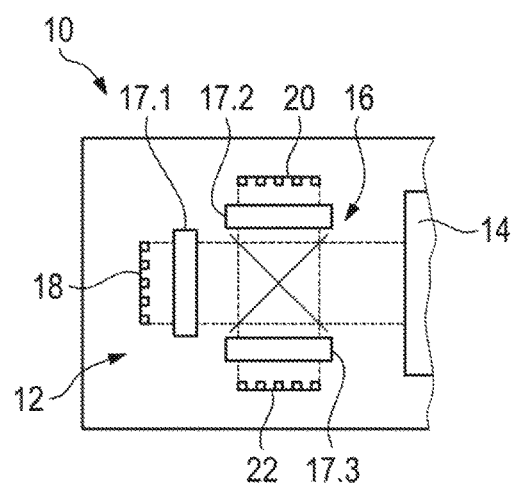
FIG. 4 shows a schematic partial view of a second embodiment of a photolithography exposure systems according to the invention.

In FIG. 4 a second embodiment of the exposure system 10 is shown. This basically equals the one of the first embodiment, wherein identical and functionally identical parts are given the same reference number.

The difference regarding the exposure system of the embodiment according to FIG. 1 is that the integrator optics is not disposed between the beam splitting unit 16 and the optics 14, but that three different integrator optics 17.1, 17.2, and 17.3 are provided.

Said integrated optics 17.1, 17.2, and 17.3 are arranged between one of the light sources 18, 20, and 22 and the beam splitting unit 16, respectively.

It is also conceivable to extend the light source arrangement with one or two light sources. In relation to the drawing plane of the Figures, said light sources are then arranged under or above the beam splitting unit 16, beyond the drawing plane. In this case, the beam splitting unit 16 also comprises further beam splitting plates, which also reflect the light of the additional light sources into output A. The function of the beam splitting unit 16 corresponds to that of the first embodiment, but it comprises five inputs and one output, It is of course conceivable that the beam splitting unit 16 is formed by an X-cube. An X-cube is an arrangement of four prisms, for example, that are arranged in a way, that the complete arrangement has a rectangular cross-section. Of course, corresponding to the surfaces of the beam splitting plates, the surfaces of the prisms have to be provided with a wavelength selective, reflective coating.

It is of course also conceivable that LEDs in different wavelengths than the wavelengths described above are used. However, the wavelengths of the LEDs have to be spaced far enough to each another, thus each beam splitting plate or the coating of the beam splitting plate only reflects the light of one LED, respectively.

The invention claimed is:

1. A light source arrangement for a photolithography exposure system having at least three light sources of different wavelengths and a beam splitting unit comprising at least three inputs, an output, and at least two reflecting faces, wherein an input is assigned to each light source and to each reflecting face, wherein the reflecting face reflects light emitted from the light source assigned to the corresponding input thereof, into the output, and wherein the three light sources are arranged on three different sides around the beam splitting unit.

2. The light source arrangement of claim 1 wherein the light sources emit light with a wavelength smaller than 500 nm, in particular a wavelength smaller than 450 nm.

3. The light source arrangement of claim 1 wherein the wavelength of at least one of the light sources corresponds to the i-line, the h-line, or the g-line of the emission spectrum of a mercury vapor lamp.

4. The light source arrangement of claim 1 wherein the light sources comprise one or more LEDs and/or a LED array.

5. The light source arrangement of claim 1 wherein the beam splitting unit comprises two beam splitting plates which are arranged perpendicular to one another and form an angle, in particular of about 45°, with the optical axes of the light sources.

6. The light source arrangement of claim 5 wherein at least one surface of each beam splitting plate forms a reflecting face of the beam splitting unit, wherein the surface is facing or is opposite to the corresponding input and the output.

7. The light source arrangement of claim 5 wherein the surface is provided with a wavelength selective, reflective coating, which reflects the light of the corresponding light source to at least 50%, preferably to at least 75%, more preferably to at least 90%, and which is basically transparent to light emitted from the other light sources.

8. The light source arrangement of claim 1 wherein the beam splitting unit is formed by an X-cube.

9. The light source arrangement of claim 1 wherein the beam splitting unit is formed by an arrangement of four prisms.

10. The light source arrangement of claim 9 wherein the prisms are arranged in a way that the whole arrangement comprises a rectangular cross-section.

11. The light source arrangement of claim 9 wherein the surfaces of the prisms are provided with a wavelength selective, reflective coating.

12. The light source arrangement of claim 1 wherein the optical axes of opposite inputs are coaxial and/or the optical axis of the output and of the input opposite to it are coaxial.

13. A photolithography exposure system comprising a light source arrangement having at least three light sources of different wavelengths and a beam splitting unit comprising at least three inputs, an output, and at least two reflecting faces, wherein an input is assigned to each light source and to each reflecting face, wherein the reflecting face reflects light emitted from the light source assigned to the corresponding input thereof, into the output, and wherein the three light sources are arranged on three different sides around the beam splitting unit.

14. The photolithography exposure system of claim 13 wherein the photolithography exposure system comprises an integrator optics, which is arranged on the output side of the beam splitting unit.

15. The photolithography exposure system of claim 13 wherein the photolithography exposure system comprises at least three integrator optics, which are arranged between the beam splitting unit and one of the light sources, respectively.

16. A light source arrangement for a photolithography exposure system having at least three light sources of different wavelengths and a beam splitting unit comprising at least three inputs, an output, and at least two reflecting faces, wherein an input is assigned to each light source and to each reflecting face, wherein the reflecting face reflects light emitted from the light source assigned to the corresponding input thereof, into the output, wherein the three light sources are arranged on three different sides around the beam splitting unit, and all the light sources emit light with a wavelength smaller than 500 nm, in particular a wavelength smaller than 450 nm.

* * * * *